United States Patent [19]

Mancuso et al.

[11] Patent Number: 5,621,474

[45] Date of Patent: Apr. 15, 1997

[54] FILTER WORKING ON IMAGE DIGITAL SIGNALS FOR VIDEO APPLIANCES

[75] Inventors: Massimo Mancuso, Monza; Rinaldo Poluzzi, Milan; Gianguido Rizzotto, Civate, all of Italy

[73] Assignee: SGS-Thomson Microelectronics S.r.l., Agrate Brianza, Italy

[21] Appl. No.: 345,512

[22] Filed: Nov. 28, 1994

[51] Int. Cl.$^6$ .............................. H04N 5/21; H04N 5/213
[52] U.S. Cl. ........................ 348/606; 348/607; 382/264; 364/724.01
[58] Field of Search ...................................... 348/625, 627, 348/628, 629, 606, 607, 618, 619, 620, 622, 623; 382/176, 264, 266; 364/413.25, 724.01; H04N 5/21, 5/23

[56] References Cited

U.S. PATENT DOCUMENTS 4,918,528  4/1990  Oohashi ................................. 348/625

FOREIGN PATENT DOCUMENTS 0415648  3/1991  European Pat. Off. ........ G06F 15/66

OTHER PUBLICATIONS

Patent Abstracts of Japan, vol. 17, No. 445 (P–1593) Aug. 16, 1993 & JP–A–05 094 523 (Yokogawa Medical Syst. Ltd.).

Patent Abstracts of Japan, vol. 17, No. 366 (P–1571) Jul. 9, 1993 & JP–A–05 054 190 (Toshiba Corp.).

Electronics Letters, vol. 26, No. 13, Jun. 21, 1990, UK pages 908–910, Shen Q. "Fuzzy Intrafram Smoothing of a Noisy Image".

*Primary Examiner*—Michael Lee
*Attorney, Agent, or Firm*—David M. Driscoll; James H. Morris

[57] ABSTRACT

A filter acting on digital image signals for apparatus of the video type includes at least first and second processing units adapted to elect an image edge, each processing unit includes an inferential circuit operating on fuzzy logic, which has first and second input terminals and an output terminal, and first and second comparison elements each having first and second input terminals and an output terminal, the input terminals being intended for receiving discrete digital signals of an image. The output terminals of the first and second comparison elements in the first processing unit are respectively connected to the first and second input terminals of the inferential circuit included in the first processing unit, and the output terminals of the first and second comparison elements in the second processing unit are respectively connected to the first and second input terminals of the inferential circuit included in the second processing unit.

33 Claims, 1 Drawing Sheet

FILTER WORKING ON IMAGE DIGITAL SIGNALS FOR VIDEO APPLIANCES

BACKGROUND OF THE INVENTION

1. Field of the Invention

This invention relates to filters for use in video applications, and more particularly to a filter that reduces noise contained in digital video signals.

2. Discussion of the Related Art

It is known that, in general, a reduction of the noise contained in signals can be obtained through filters of the low-pass type having a predetermined cutoff frequency. However, the use of such filters involves in most cases a reduction of a signal portion which may contain useful information.

With video signals, for example, the use of low-pass filters involves an attenuation of the high-frequency components which contain useful information about the image outline.

To alleviate this drawback, adaptive filters have been employed which adapt their frequency response to the characteristics of the signals that appear at their inputs.

Such filters require, however, considerable computation work for their implementation due to their highly complicated circuitry. In video signal processing, noise reduction has been achieved using non linear filters including a filter known in literature as a median filter, as well as linear filters of the bi-dimensional low-pass type formed by conventional synthesis methods which often result in loss of useful information.

For video signals, filters have also been used which operate in a logic mode based on fuzzy rules.

Fuzzy methods for use in filtering techniques directed to reduce the noise contained in video signals are described, for example, in the following articles: F. Russo and G. Ramponi, "Fuzzy Operators for Sharpening of Noisy Images", Electronics Letters, Vol. 28, No. 18, August 1992; F. Russo and G. Ramponi, "Working on Image Data Using Fuzzy Rules", Signal Processing IV Theories and Applications, Proceedings of EUSIPCO-92, Brussels, Belgium, August 1992 and C. W. Tao and W. E. Thompson, "A Fuzzy If-Then Approach to Edge Detection", Proceedings of Second IEEE Conference on Fuzzy System, San Francisco, Calif., March/April 1993. Filters operating on fuzzy logic are, however, complex architectures at the structural level and costly to manufacture.

SUMMARY OF THE INVENTION

An object of this invention is to provide a filter for reducing the noise contained in video signals which, in addition to having a structurally simple architecture which is relatively inexpensive to make, can filter out the signal portion that contains noise rather than the useful information.

An embodiment of the invention is directed to a filter acting on digital image signals for apparatus of the video type. The filter includes a first processing circuit and a second processing circuit adapted to indicate a possible image edge. Each processing circuit has an inferential circuit operating on fuzzy logic. Each inferential circuit has first and second input terminals and an output terminal. Each processing circuit further includes first and second comparison elements. Each comparison element has first and second input terminals and an output terminal. The input terminals of each comparison element are intended for receiving discrete digital signals of an image. The output terminals of the first and second comparison elements in the first processing circuit are respectively connected to the first and second input terminals of the inferential circuit included in the first processing circuit. The output terminals of the first and second comparison elements in the second processing circuit are respectively connected to the first and second input terminals of the inferential circuit included in the second processing circuit.

Another embodiment of the invention uses a digital subtractor circuit for each comparison element.

Another embodiment of the invention has the inferential circuit of each processing circuit including a storage circuit to store results of the fuzzy logic.

In one embodiment, the inferential circuits C1 and C2 perform fuzzy computations online. Each of the two inferential circuits C1 and C2 includes a "fuzzy machine". Each "fuzzy machine" performs a fuzzy computation that analyzes pixels in a particular direction. In this way, each "fuzzy machine" determines the possible existence of an image edge in the corresponding particular direction.

In another embodiment, each of the two inferential circuits C1 and C2 includes fuzzy logic in combination with a memory device. This combination enables the implementation of a look-up table feature for each inferential circuit to achieve the same results. The inputs to the inferential circuits are used in this embodiment to construct the appropriate address in the look up table.

Another embodiment of the invention includes line operators formed by the comparison elements and the inferential circuit of each processing element, each line operator defining triggering levels dependent on difference signals generated by the comparison elements.

Another embodiment of the invention includes a noise detecting circuit connected to the output terminals of the processing circuits, the noise detecting circuit including a storage element.

Another embodiment of the invention has the storage element of the noise detecting circuit including a storage register adapted to store predetermined triggering levels.

Another embodiment of the invention has each storage element as a fuzzy computation element.

Another embodiment of the invention has the noise detecting circuit carrying out, using logic rules of the fuzzy logic type, a comparison between the triggering levels defined in the inferential circuits and the predetermined triggering levels.

Another embodiment of the invention further includes a noise reducing circuit having first and second input terminals, the first input terminal of the noise reducing circuit being coupled to the noise detecting circuit and the second input terminal of the noise reducing circuit being appended to receive the digital image signals. The noise reducing circuit is adapted to perform operations on the digital image signals according to the comparison carried out by the noise detecting circuit using logic rules of the fuzzy type at discrete times separated by predetermined time periods.

Another embodiment of the invention is directed to a filter that reduces noise contained within a video signal that represents an image. The filter includes an input that receives the video signal, the video signal including a pixel under processing and a plurality of neighboring pixels. The filter further includes a first processing circuit that obtains the video signal from the input, and provides a first indication signal that indicates a possible edge in the image represented by the video signal. The processing circuit includes a first comparison element and a second comparison element, each comparison element having a first input that receives the pixel under processing, a second input that receives one of the plurality of neighboring of pixels, and an output that provides a comparison result. The second inputs of the first and second comparison elements receive one of the plurality of neighboring pixels in a first direction. The first processing circuit further includes a first inferential circuit having a first input and a second input that receives the comparison results from the first and second comparison elements, respectively, and an output that provides the first indication signal.

Another embodiment of the invention has the filter including a second processing circuit that provides a second indication signal indicating a possible edge in a second direction in the image.

Another embodiment of the invention is directed to a filter that reduces noise contained within a video signal that represents an image. The filter includes means for receiving the video signal, the video signal including a pixel under processing and a plurality of neighboring pixels, and means for obtaining the video signal from the means for receiving, and providing a first indication signal that indicates a possible edge in the image represented by the video signal. The first means for obtaining and providing includes a first comparison element and a second comparison element, each comparison element having a first input that receives the pixel under processing, a second input that receives one of the plurality of neighboring pixels, and an output that provides a comparison result. The second inputs of the first and second comparison elements receive one of the plurality of neighboring pixels in a first direction. The first means for obtaining and providing further includes a first inferential circuit having a first input and a second input that receive the comparison results from the first and second comparison elements, respectively, and an output that provides the first indication signal.

Another embodiment of the invention is directed to a method for reducing noise contained within a video signal that represents an image. The video signal has a pixel under processing and a plurality of neighboring pixels. The method includes the steps of providing the video signal, and providing a first indication signal that indicates a possible edge in the image represented by the video signal. The step of providing includes the steps of providing comparison results between the pixel under processing and the neighboring pixels in a first direction, and outputting the first indication signal according to the comparison results.

Another embodiment of the invention has the method further including the step of providing a second indication signal that indicates a possible edge in the image represented by the video signal. The step of providing a second indication signal includes the steps of providing comparison results between the pixel under processing and the neighboring pixels in a second direction, and outputting the second indication signal according to the comparison results.

Another embodiment of the invention includes the step of performing inference operations and providing one of the first and second indication signals within a predetermined range according to the inference operations.

Another embodiment of the invention includes the step of receiving the indication signals, comparing the indication signals to a set of predetermined values to generate a result, and providing a detection signal according to the result.

Another embodiment of the invention further includes the step of receiving the detection signal, receiving the video signal having the pixel under processing, and modifying the pixel under processing according to the detection signal, the noise contained within the video signal being reduced when the pixel under processing is modified.

The features and advantages of a filter acting on digital image signals for apparatus of the video type, according to the invention, will be apparent from the following description of an embodiment thereof, given by way of example and not of limitation, with reference to the accompanying drawing.

DETAILED DESCRIPTION

Figure 1:
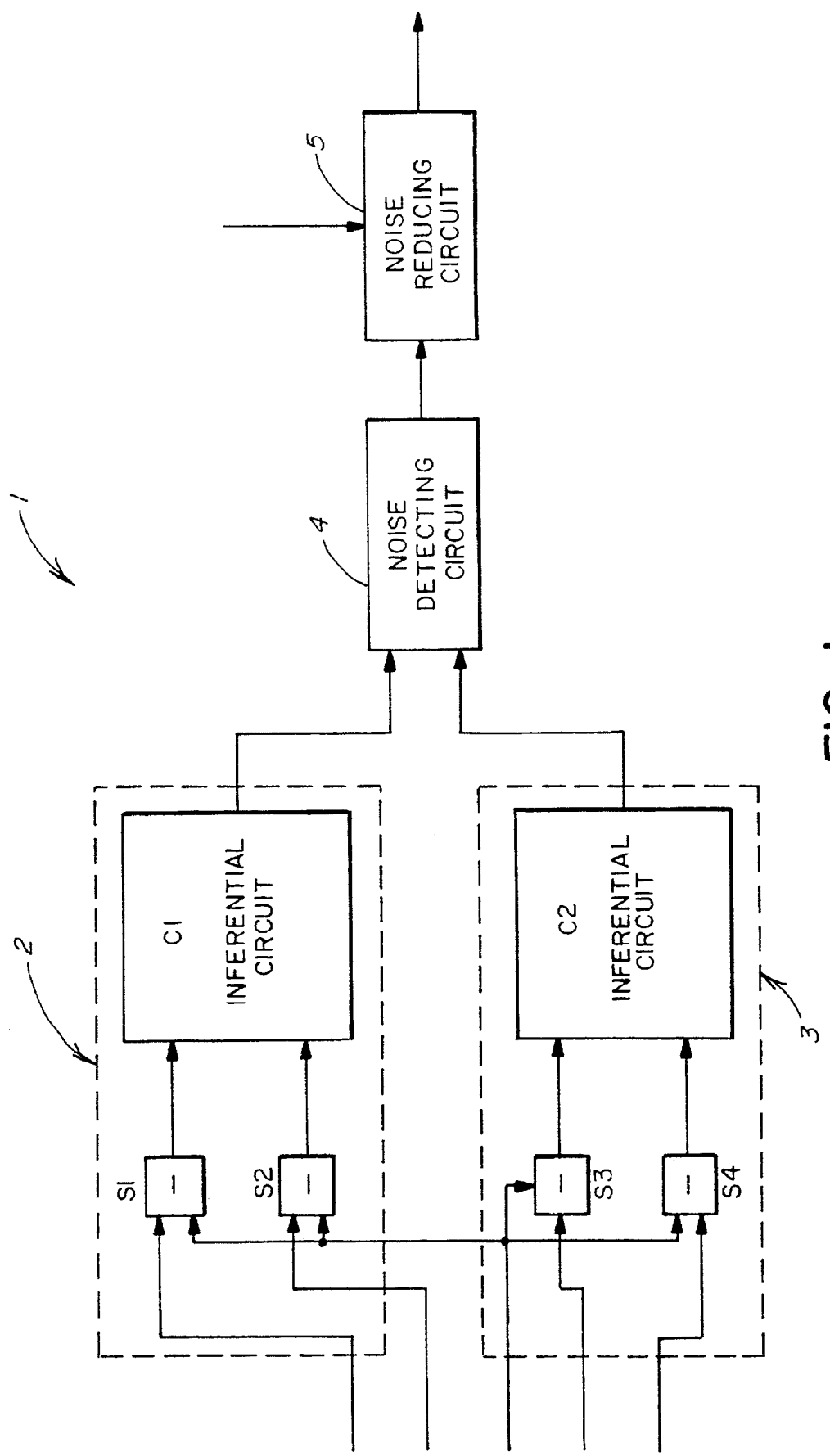
FIG. 1 shows a diagramatic view of a filter embodying the invention.

The diagram of FIG. 1 illustrates a filter (1) acting on digital image signals for apparatus of the video type, which comprises at least first and second processing units (2) and (3) that indicate a possible image edge.

Each processing unit comprises an inferential circuit (C1 or C2) operating on fuzzy logic, which has first and second input terminals and an output terminal, and at least first and second digital subtractors (S1 and S2, or S3 and S4) each having first and second input terminals and an output terminal, the input terminals being intended for receiving discrete digital image signals carrying information about the image pixels to be processed. Each inferential circuit includes a lookup table.

In one embodiment, the digital image signals include a pixel under processing and a plurality of neighboring pixels. The pixel under processing is received by one input of each subtractor of a processing unit while neighboring pixels along a particular direction are received by the other input of each subtractor.

The output terminals of the first and second digital subtractors S1 and S2 in the first processing unit (2) are respectively connected to the first and second input terminals of the inferential circuit C1, included in the first processing unit. Similarly, the output terminals of the first and second digital subtractors S3 and S4 in the second processing unit (3) are respectively connected to the first and second input terminals of the inferential circuit C2 included in the second processing unit.

Each inferential circuit has a storage circuit wherein line operators that define triggering levels tied to difference signals generated by the digital subtractors are stored. A line operator is a computational structure within each processing unit that includes the subtractors and fuzzy features.

The defined triggering levels indicate the possible existence of an image edge along a perpendicular direction to that in which the line operator is acting.

Each triggering level is represented by a number which can take values in the [0,1] range.

The number of processing units included in the filter (1) is dependent on the size of the image to be processed, and secondarily, on the number of directions in which the line operators are acting. That is, the number of processing units increases as the number of directions increases. For example, considering a 3X3 sub-image window, if four directions have to be considered (e.g., horizontal, vertical, +45, and −45), the architecture may use four processing units C1–C4. (C3 and C4 are not shown).

The filter (1) further comprises a noise detecting circuit (4) connected to the output terminals of the processing units (2) and (3). This noise detecting circuit includes a look-up table.

This noise detecting circuit (4) is a storage element which either comprises a fuzzy computation unit or at least one storage register effective to store predetermined triggering levels.

The noise detecting circuit carries out, using logic rules of the fuzzy type, a comparison between the triggering levels defined in the inferential circuits C1 and C2 and the predetermined triggering levels.

The outcome of the comparison is represented by a number K which may take values in the [0,1] range and indicates the degree of confidence in judging whether, along the direction in which a line operator is acting, there is an image edge or noise present. The filter (1) further comprises a noise reducing circuit (5) having first and second input terminals, the first input terminal of the noise reducing circuit being coupled to the noise detecting circuit, and the second input terminal of the noise reducing circuit being intended for receiving the digital signals which carry information about pixels in the processed image.

According to one embodiment, noise reducing circuit (5) receives both the pixel under processing and the plurality of neighboring pixels on the second input.

The noise reducing circuit performs operations on the digital signals according to the value of K, at discrete times separated by predetermined time periods.

The noise reducing circuit (5) performs a noise filtering action according to the output of the noise detecting circuit (4). This output indicates a degree of filtering. The filtering may be accomplished by means of a conventional filter acting on the pixel under processing and on a set of neighboring pixels into a suitable image window (i.e., sub-image portion).

Specifically, if K=1, the noise reducing circuit first replaces and then filters the digital signals carrying information about image pixels which have been identified as noise, with a fraction of the mean of digital signals carrying image pixel information and located within the range of the pixels identified as noise that is composed of a fraction of the value of the digital signals carrying information about the pixels found to be noise. On the other hand, if K=0 everything remains unaltered.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A filter acting on digital image signals for apparatus of the video type, the filter comprising: a first processing circuit and a second processing circuit adapted to indicate a possible image edge, each of said processing circuits having an inferential circuit operating on fuzzy logic, each of said inferential circuits having first and second input terminals and an output terminal, each of said processing circuits further having first and second comparison elements, each of said comparison elements having first and second input terminals and an output terminal, said input terminals of each of said comparison elements being intended for receiving discrete digital signals of an image, said discrete digital signals including a pixel under processing and a plurality of neighboring pixels, said first input terminal of each of said comparison elements to receive the pixel under processing and each of said second input terminal of each of said comparison elements to receive one neighboring pixel of the plurality of neighboring pixels, respectively; and the output terminals of the first and second comparison elements in the first processing circuit being respectively connected to the first and second input terminals of the inferential circuit included in said first processing circuit, and the output terminals of the first and second comparison elements in the second processing circuit being respectively connected to the first and second input terminals of the inferential circuit included in said second processing circuit.

2. The filter according to claim 1, wherein each of said comparison elements is a digital subtractor circuit.

3. The filter according to claim 1, wherein the inferential circuit further includes a storage circuit to store results of the fuzzy logic.

4. The filter according to claim 1, wherein line operators, each formed by the comparison elements and the inferential circuit of one of the processing circuits, define triggering levels dependent on difference signals generated by the comparison elements.

5. The filter according to claim 4, further comprising a noise detecting circuit connected to the output terminal of the inferential circuit of each of said processing circuits, said noise detecting circuit including a storage element.

6. The filter according to claim 5, wherein the storage element includes a storage register adapted to store predetermined triggering levels.

7. The filter according to claim 6, wherein the storage element is a fuzzy computation unit.

8. The filter according to claim 7, wherein the noise detecting circuit carries out, using logic rules of the fuzzy type, a comparison between the triggering levels defined in the inferential circuits and said predetermined triggering levels.

9. The filter according to claim 8, further comprising a noise reducing circuit having first and second input terminals, the first input terminal of said noise reducing circuit being coupled to the noise detecting circuit and the second input terminal of said noise reducing circuit being intended to receive the digital image signals, said noise reducing circuit being adapted to perform operations on said digital image signals according to the comparison carried out by the noise detecting circuit using logic rules of the fuzzy type at discrete times separated by predetermined time periods.

10. The filter according to claim 1, further comprising a noise detecting circuit connected to the output terminal of the inferential circuit of each of said processing circuits, said noise detecting circuit including a storage element.

11. The filter according to claim 10, wherein the storage element includes a storage register adapted to store predetermined triggering levels.

12. The filter according to claim 11, wherein the storage element is a fuzzy computation unit.

13. The filter according to claim 10, wherein the noise detecting circuit carries out, using logic rules of the fuzzy type, a comparison between the triggering levels defined in the inferential circuits and said predetermined triggering levels.

14. The filter according to claim 13, further comprising a noise reducing circuit having first and second input terminals, the first input terminal of said noise reducing circuit being coupled to the noise detecting circuit and the second input terminal of said noise reducing circuit being intended to receive the digital image signals, said noise reducing circuit being adapted to perform operations on said digital image signals according to the comparison carried out by the noise detecting circuit using logic rules of the fuzzy type at discrete times separated by predetermined time periods.

15. A filter that reduces noise contained within a video signal that represents an image, the filter comprising:

an input that receives the video signal, the video signal including a pixel under processing and a plurality of neighboring pixels; and a first processing circuit that obtains the video signal from the input, and provides a first indication signal that indicates a possible edge in the image represented by the video signal, the first processing circuit including:

a first comparison element and a second comparison element, each of said comparison elements having a first input that receives the pixel under processing, a second input that receives one of the plurality of neighboring pixels in a first direction, and an output that provides a comparison result, and a first inferential circuit having a first input and a second input that receive the comparison results from the output of the first and second comparison elements, respectively, and an output that provides the first indication signal.

16. The filter of claim 15, further including a second processing circuit that provides a second indication signal indicating a possible edge in a second direction in the image, the second processing circuit including:

a third comparison element and a fourth comparison element, each of said comparison elements having a first input that receives the pixel under processing, a second input that receives one of the plurality of neighboring pixels in a second direction, and an output that provides a comparison result, and a second inferential circuit having a first input and a second input that receive the comparison results from the third and fourth comparison elements, respectively, and an output that provides the second indication signal.

17. The filter of claim 16, wherein each of said inferential circuits includes fuzzy logic circuitry that performs inference operations and provides one of the first and second indication signals within a predetermined range according to the inference operations.

18. The filter of claim 17, wherein each of said comparison elements is a digital subtractor circuit.

19. The filter of claim 17, wherein the comparison elements and the inferential circuit of each of said processing circuits form a line operator, each line operator defining one of the first and second indication signals according to the received first and second results from the comparison elements.

20. The filter of claim 16, further including a noise detecting circuit that receives the first and second indication signals from the first and second processing circuits, respectively, compares the first and second indication signals to a set of predetermined values to generate a detection result, and provides a detection signal according to the detection result.

21. The filter of claim 20, further including a noise reducing circuit that receives the detection signal from the noise detecting circuit and the video signal having the pixel under processing, and modifies the pixel under processing according to the detection signal, the noise contained within the video signal being reduced when the pixel under processing is modified.

22. A filter that reduces noise contained within a video signal that represents an image, the filter comprising:

means for receiving the video signal, the video signal including a pixel under processing and a plurality of neighboring pixels; and first means for obtaining the video signal from the means for receiving, and providing a first indication signal that indicates a possible edge in the image represented by the video signal, the first means for obtaining and providing including:

a first comparison element and a second comparison element, each of said comparison elements having a first input that receives the pixel under processing, a second input that receives one of the plurality of neighboring pixels in a first direction, and an output that provides a comparison result, and a first inferential circuit having a first input and a second input that receive the comparison results from the output of the first and second comparison elements, respectively, and an output that provides the first indication signal.

23. The filter of claim 22, further including:

a second means for obtaining the video signal from the means for receiving, and providing a first indication signal that indicates a possible edge in the image represented by the video signal, the second means for obtaining and providing including:

a third comparison element and a fourth comparison element, each of said comparison elements having a first input that receives the pixel under processing, a second input that receives one of the plurality of neighboring pixels in a second direction, and an output that provides a comparison result, and a second inferential circuit having a first input and a second input that receive the comparison results from the first and second comparison elements, respectively, and an output that provides the second indication signal.

24. The filter of claim 23, wherein each of said inferential circuits includes fuzzy logic circuitry that performs inference operations and provides one of the first and second indication signals within a predetermined range according to the inference operations.

25. The filter of claim 24, wherein each of said comparison elements is a digital subtractor circuit.

26. The filter of claim 24, wherein the comparison elements and the inferential circuit of each of said first and second means for obtaining and providing forms a line operator, each line operator defining one of the first and second indication signals according to the received first and second results from the comparison elements.

27. The filter of claim 23, further including:

means for receiving the indication signals from the processing circuit, comparing the indication signals to a set of predetermined values to generate a result, and providing a detection signal according to the result.

28. The filter of claim 27, further including:

means for receiving the detection signal from the means for receiving, comparing and providing; receiving the video signal having the pixel under processing; and modifying the pixel under processing according to the detection signal, the noise contained within the video signal being reduced when the pixel under processing is modified.

29. A method for reducing noise contained within a video signal that represents an image, the video signal having a pixel under processing and a plurality of neighboring pixels, the method comprising the steps of:

receiving the video signal; and providing a first indication signal that indicates a possible edge in the image represented by the video signal, the step of providing the first indication signal including the steps of:

generating comparison results between the pixel under processing and the neighboring pixels in a first direction, and outputting the first indication signal according to the generated comparison results.

30. The method of claim 29, further including the step of:

providing a second indication signal that indicates a possible edge in the image represented by the video signal, the step of providing a second indication signal including the steps of:

generating comparison results between the pixel under processing and the neighboring pixels in a second direction, and outputting the second indication signal according to the generated comparison results.

31. The method of claim 30, wherein the steps of providing comparison results includes the step of:

performing inference operations and providing one of the first and second indication signals within a predetermined range according to the inference operations.

32. The method of claim 31, further including the step of:

receiving the indication signals, comparing the indication signals to a set of predetermined values to generate a result, and providing a detection signal according to the result.

33. The method of claim 32, further including the step of:

receiving the detection signal, receiving the video signal having the pixel under processing, and modifying the pixel under processing according to the detection signal, the noise contained within the video signal being reduced when the pixel under processing is modified.

* * * * *

UNITED STATES PATENT AND TRADEMARK OFFICE
CERTIFICATE OF CORRECTION

PATENT NO. : 5,621,474
DATED : April 15, 1997
INVENTOR(S) : Massimo Mancuso, Rinaldo Poluzzi and Gianguido Rizzotto It is certified that error appears in the above-identified patent and that said Letters Patent is hereby corrected as shown below:

On the title page, item [30] should read:

[30]  Foreign Application Priority Data

November 30, 1993   [EP]   Europe.......93830483.9

Signed and Sealed this

Fourteenth Day of April, 1998

Attest:

BRUCE LEHMAN

*Attesting Officer*            *Commissioner of Patents and Trademarks*